US012794196B2

(12) United States Patent
Ben Bakir et al.

(10) Patent No.: US 12,794,196 B2
(45) Date of Patent: Nov. 10, 2026

(54) SYSTEM COMPRISING A LIGHT SOURCE ON A SUBSTRATE WITH A HIGH OPTICAL INDEX AND ASSOCIATED METHOD

(71) Applicant: COMMISSARIAT À L'ENERGIE ATOMIQUE ET AUX ENERGIES ALTERNATIVES, Paris (FR)

(72) Inventors: Badhise Ben Bakir, Grenoble Cedex (FR); Olivier Lartigue, Grenoble Cedex (FR); Christophe Constancias, Grenoble Cedex (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 501 days.

(21) Appl. No.: 18/541,852

(22) Filed: Dec. 15, 2023

(65) Prior Publication Data

US 2024/0204483 A1 Jun. 20, 2024

(30) Foreign Application Priority Data

Dec. 16, 2022 (FR) ....................................... 2213549

(51) Int. Cl.
*H01S 5/20* (2006.01)

(52) U.S. Cl.
CPC .......... *H01S 5/2027* (2013.01); *H01S 5/2031* (2013.01)

(58) Field of Classification Search
CPC ............................ H01S 5/2027; H01S 5/2031
See application file for complete search history.

(56) References Cited

U.S. PATENT DOCUMENTS

2004/0208213 A1* 10/2004 Lichtenstein ............. H01S 5/20 372/45.012
2015/0260913 A1* 9/2015 Li .......................... G02B 6/124 385/14

FOREIGN PATENT DOCUMENTS

CN 101496238 A 7/2009

OTHER PUBLICATIONS

Search Report as issued in French Patent Application No. FR2213549, dated Jul. 6, 2023.
Li, X., et al., "Quality factor control of Si-based two-dimensional photonic crystals with a Bragg mirror," Applied Physics Letters, vol. 88, No. 9, Mar. 2006, XP012083059, pp. 91122-091122.
Kwon, K., et al., "Nano pillar array laser with a bottom metal plane," 2013 International Conference on Optical Mems and Nanophotonics (OMN), IEEE, Aug. 2012, XP032261850, pp. 230-231.
Coutard, J.G., et al., "Volume Fabrication of Quantum Cascade Lasers on 200 mm-CMOS pilot line," Scientific Reports 10, 6185 (Year: 2020), 8 pages.

* cited by examiner

*Primary Examiner* — Michael Carter
(74) *Attorney, Agent, or Firm* — CUSHMAN PARTNERS LLC

(57) ABSTRACT

A system includes a light source configured to have at least one stationary mode of an electromagnetic field parallel to a plane; a substrate, parallel to the plane and having a high optical index; and an anti-resonant reflector for the at least one stationary mode, the reflector extending over the substrate, the source extending over the reflector.

11 Claims, 7 Drawing Sheets

[Fig. 1]
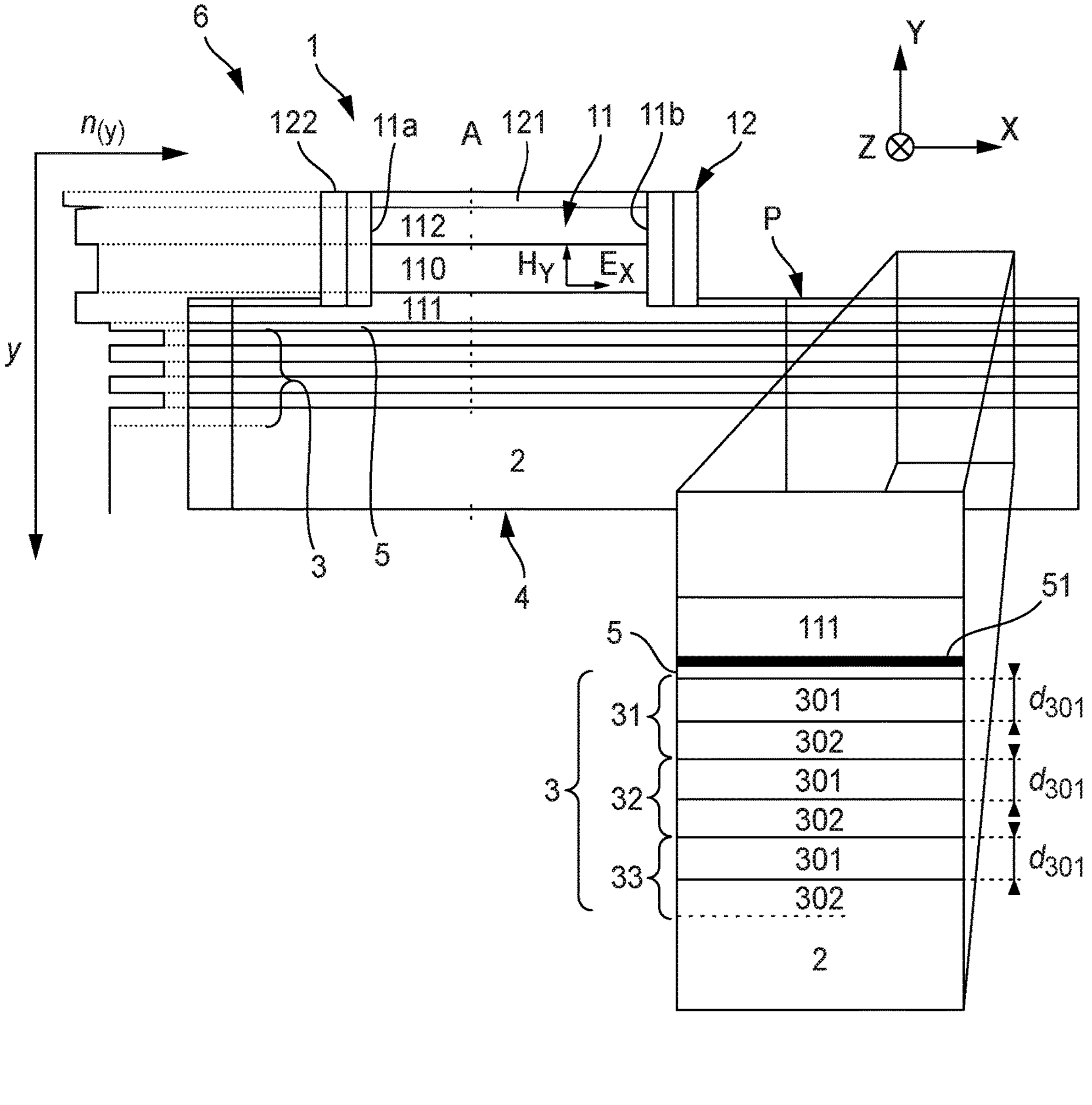

[Fig. 2]
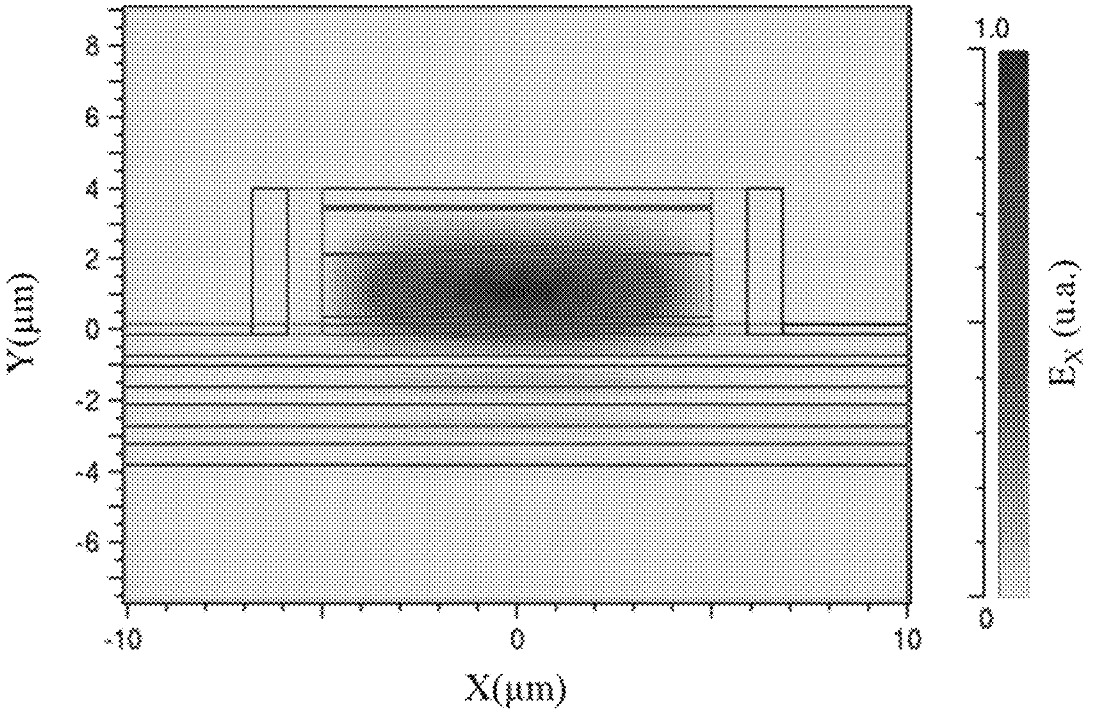
[Fig. 3]
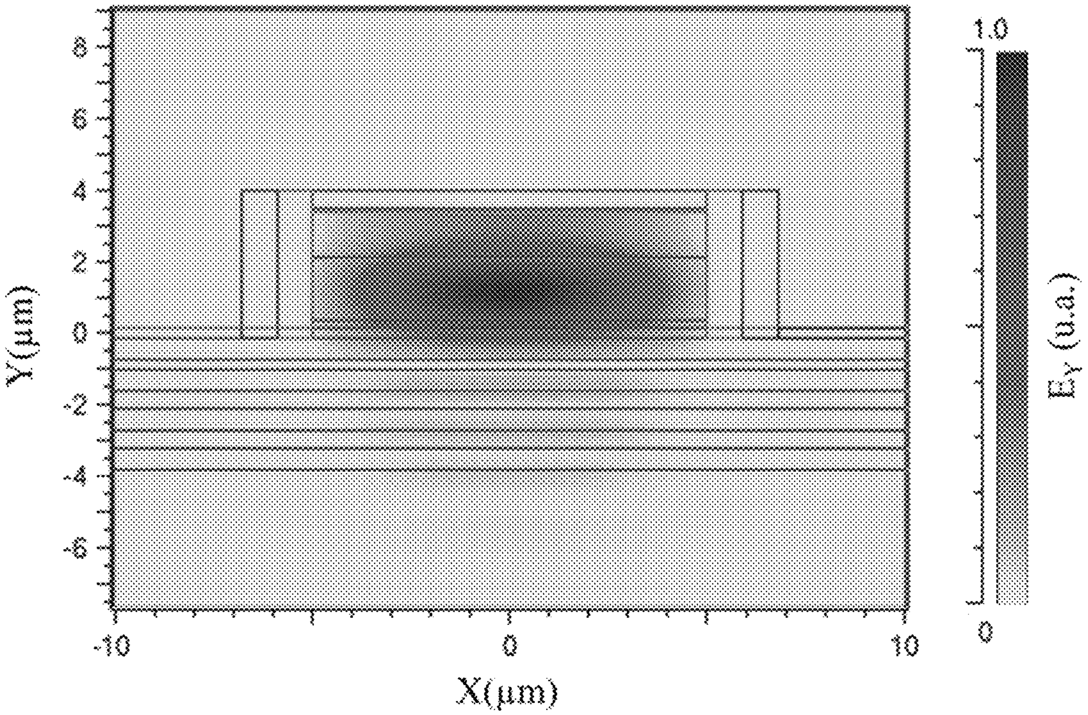

[Fig. 4]
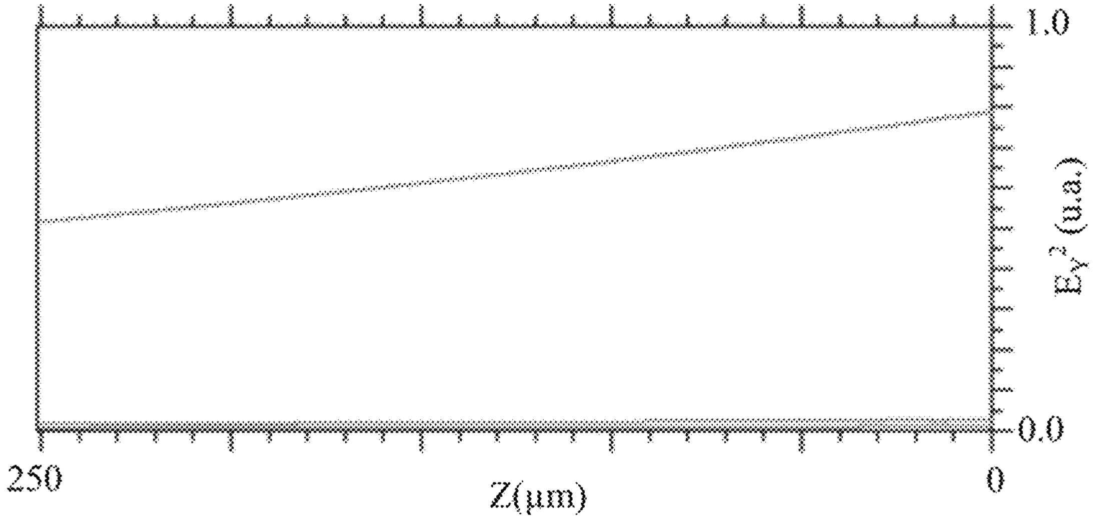
[Fig. 5]
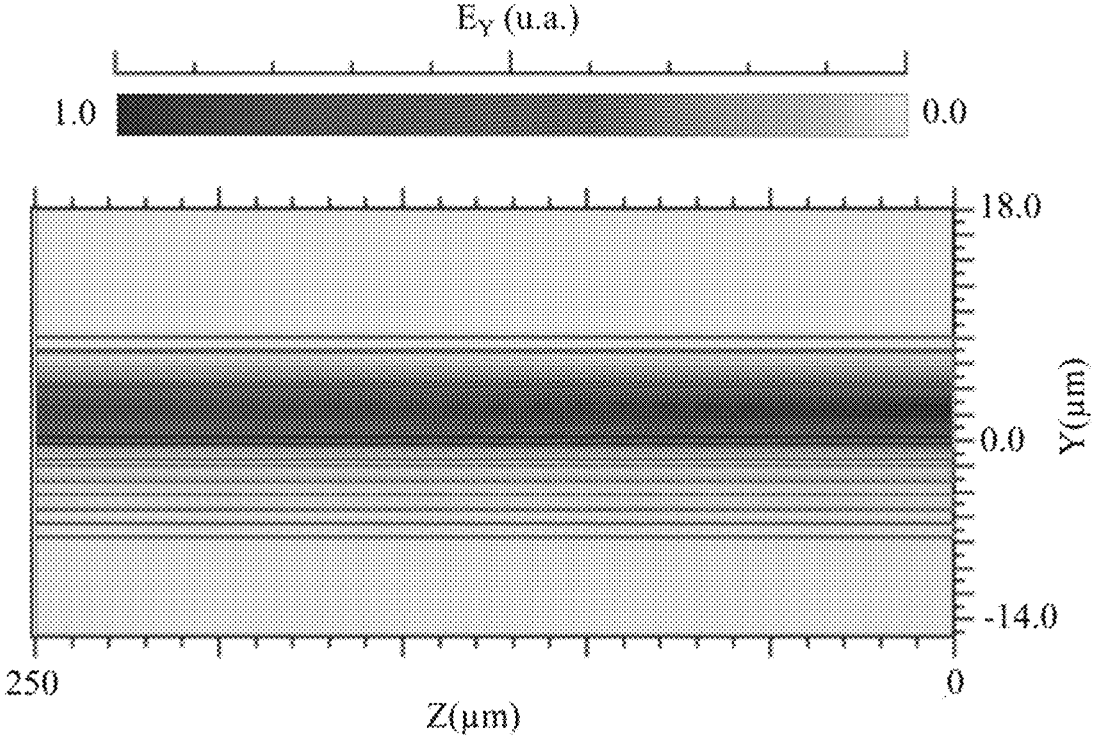

[Fig. 6]
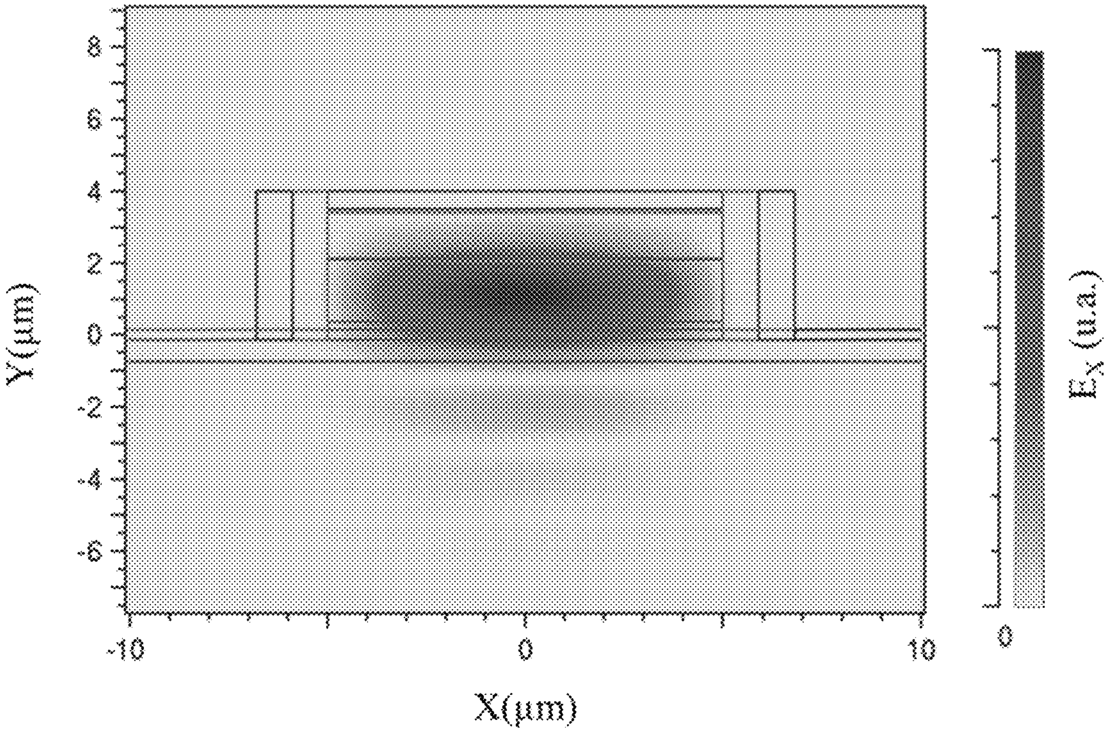
[Fig. 7]
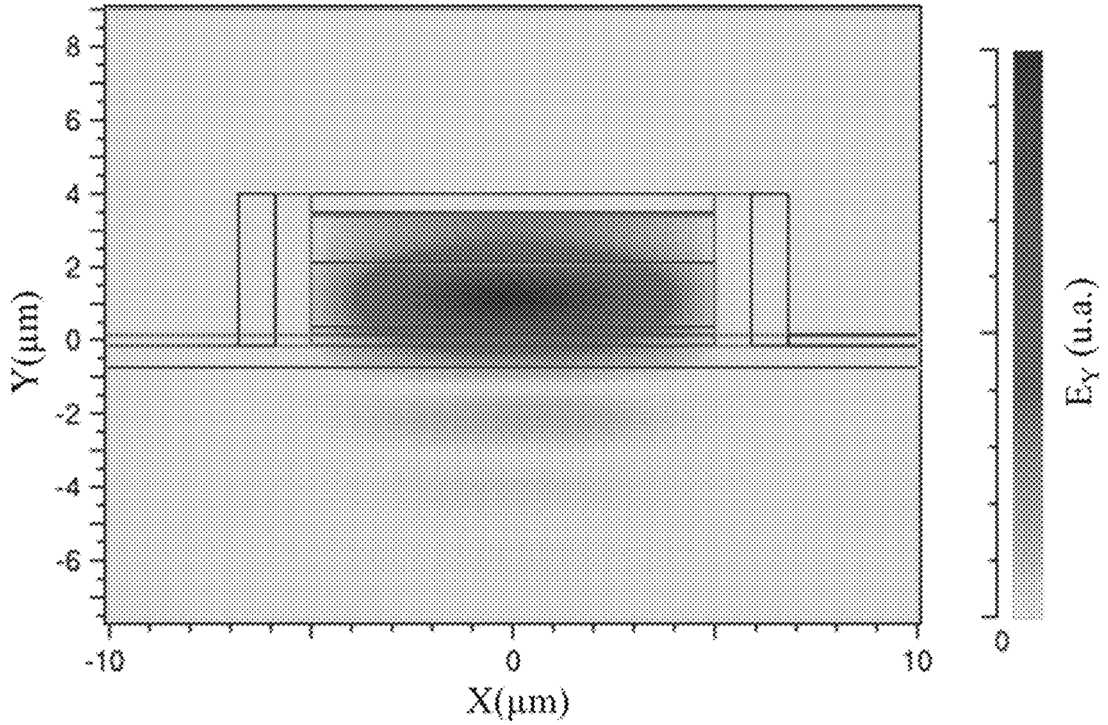

[Fig. 8]
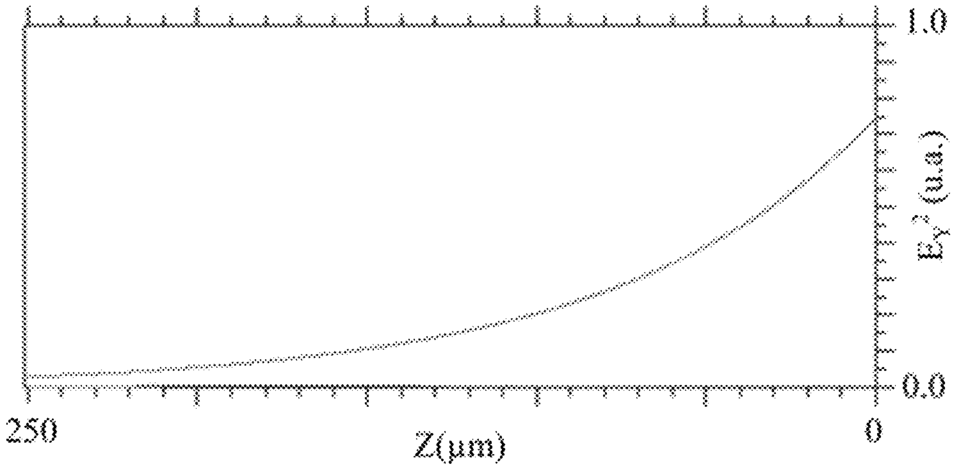
[Fig. 9]
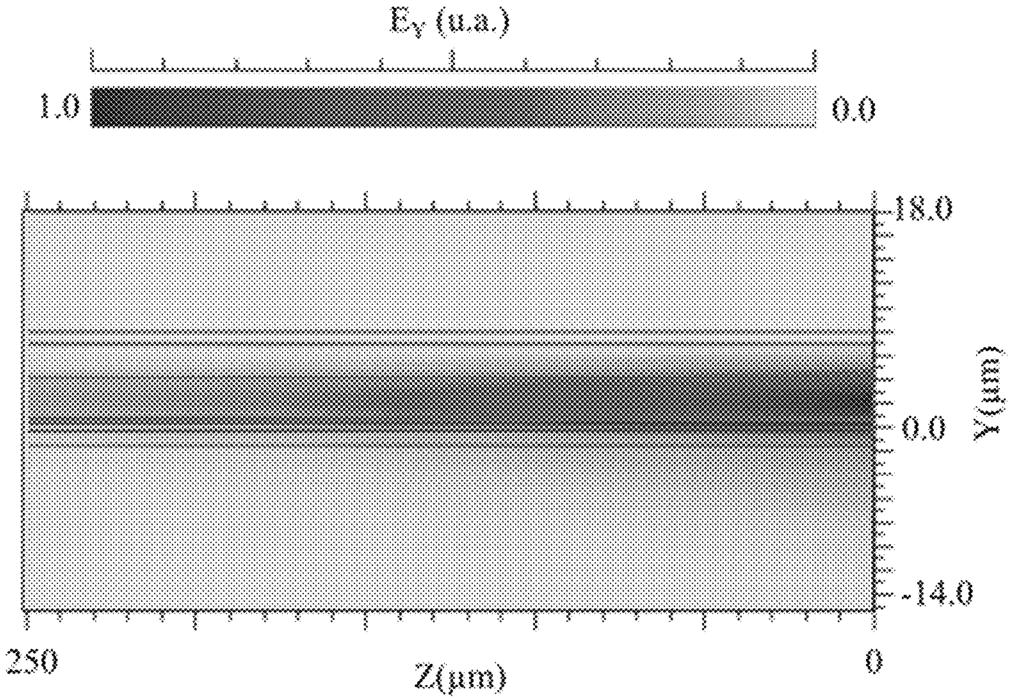

[Fig. 10]
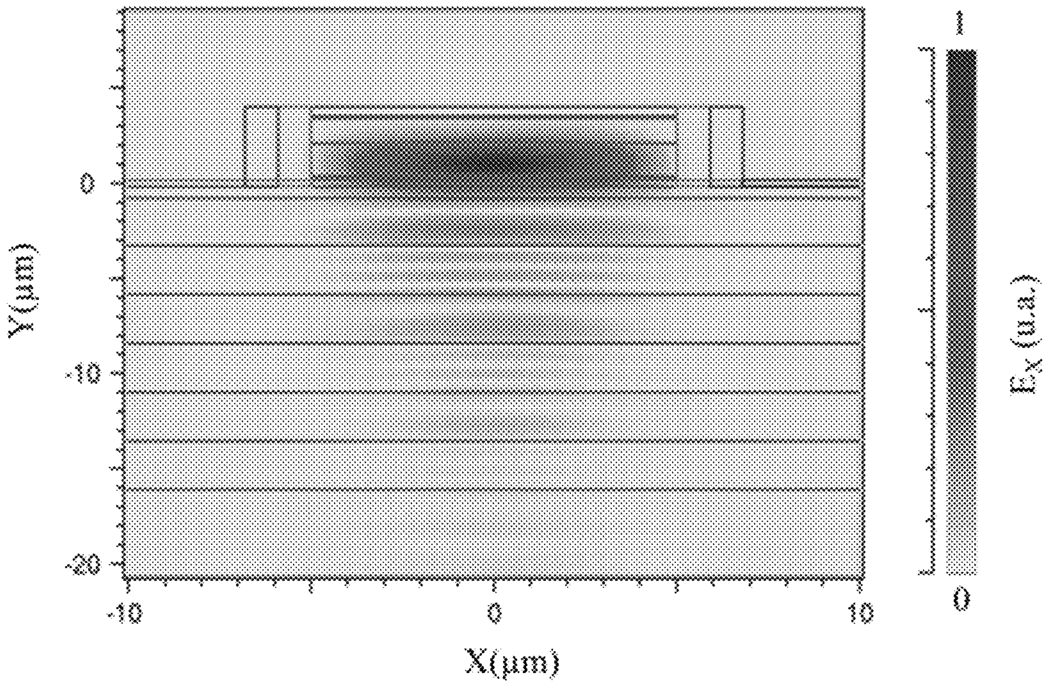
[Fig. 11]
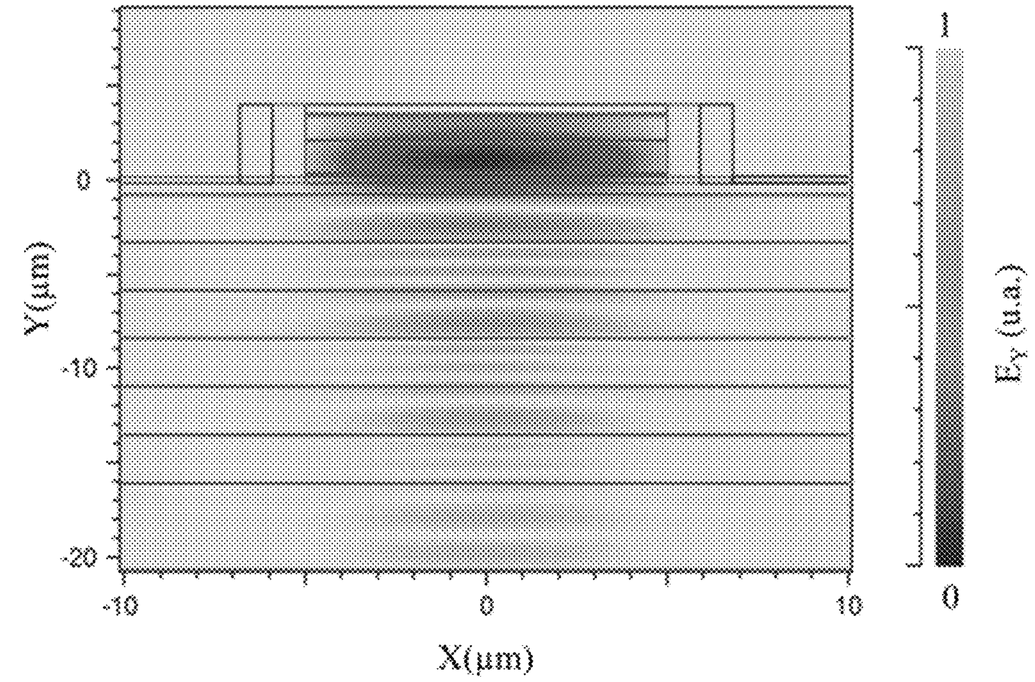

[Fig. 12]
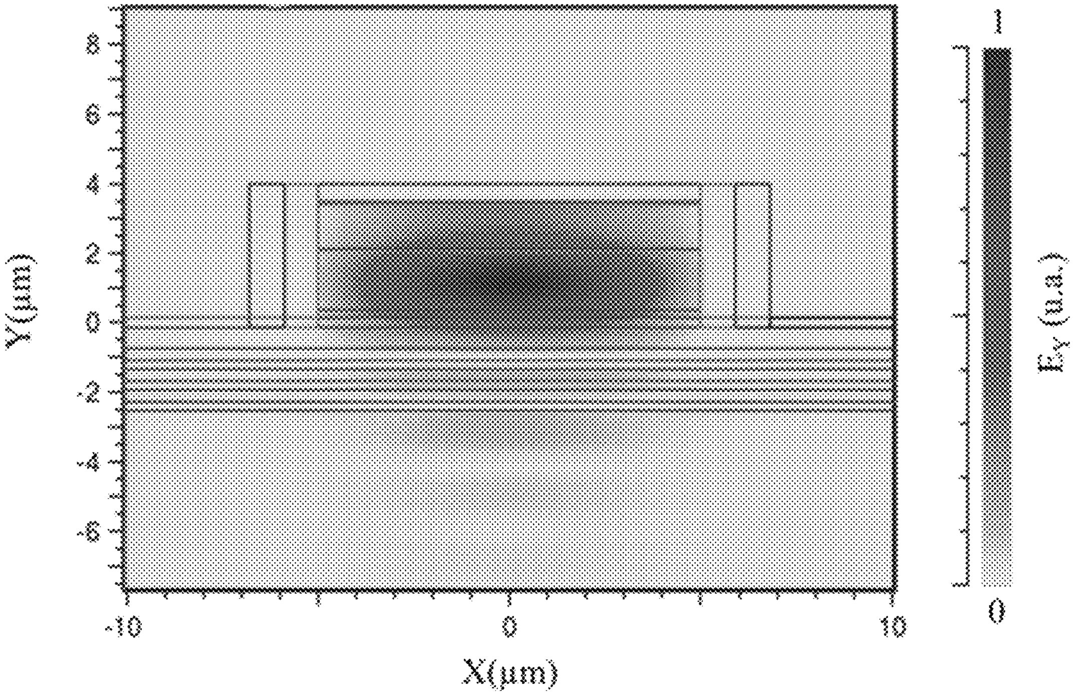
[Fig. 13]
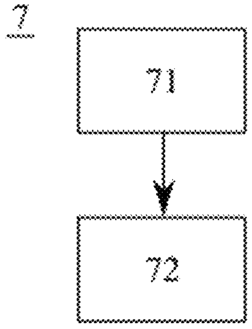

SYSTEM COMPRISING A LIGHT SOURCE ON A SUBSTRATE WITH A HIGH OPTICAL INDEX AND ASSOCIATED METHOD

CROSS-REFERENCE TO RELATED APPLICATIONS

This application claims priority to French Patent Application No. 2213549, filed Dec. 16, 2022, the entire content of which is incorporated herein by reference in its entirety.

FIELD

The technical field of the invention is the integration of a light source onto a substrate having a high optical index.

BACKGROUND

Light sources that can be integrated onto a substrate have many applications, such as the photoacoustic detection of chemical compounds. In order to benefit from the advantages provided by several distinct technologies, it is sought to integrate light sources manufactured using a particular technology onto a substrate not derived from that technology. This is known as "hybrid" technology. One example is the integration of so-called "III-V" light sources onto a silicon semiconductor substrate.

III-V light sources are made from a semiconductor alloy also called "III-V", that is, comprised of a semiconductor material belonging to group III (column 13 of the Periodic Table of Elements) and a semiconductor material belonging to group V (column 15 of the Periodic Table of Elements). Common alloys comprise, for example, InP, InAs, GaAs, GaN or InSb. III-V light sources are good candidates for emitting a beam in an extended spectral range, such as mid-infrared. However, these sources have major integration restrictions, especially when they have to be integrated into the silicon substrate.

A laser type light source, whether of the III-V type or not, comprises a cavity formed by a stack of layers comprising a so-called "active" or "amplifying" region and two so-called "cladding" semiconductor layers. The active region is configured to emit an electromagnetic field by spontaneous and/or stimulated emission. The cladding layers are adjacent to the active region and disposed on either side of the same to confine certain modes of the electromagnetic field, called "guided modes". In order to effectively confine the guided mode(s), cladding layers have optical indices that are strictly less than the average optical index of the active region. For example, when the active region is comprised of a multilayer of InGaAs/AlInAs or InAlAs/AlGaInAs, the cladding layers are made of InP.

The light source, directly disposed on a Si substrate, can suffer high optical losses, which are a handicap for its use. Indeed, silicon has a higher optical index than III-V materials, such as InP, and therefore higher than the cladding layers. Thus, without any special provision and when the penetration of the guided mode into the cladding layers is significant, said guided mode can couple to the Si substrate and reduce the effectiveness of the confinement provided by the cladding layers.

To overcome this problem, it is provided that the cladding layer separating the active region from the Si substrate, called the lower cladding layer, is relatively thick. This thus compensates for the depth of penetration of the guided mode into the cladding layers and reduces the coupling of the guided mode to the Si substrate. For a guided mode having a wavelength of 4.5 μm, the thickness of the lower cladding layer has to be at least 3.5 μm. This represents a significant cost in terms of raw material and also an additional restriction to the integration of the source. For a guided mode having a wavelength greater than 10 μm (far infrared), the thickness of the lower cladding layer would have to be greater than 20 μm, which can make source integration even more complex.

One solution provided by document [Coutard, J. G., Brun, M., Fournier, M. et al. Volume Fabrication of Quantum Cascade Lasers on 200 mm-CMOS pilot line". Sci Rep 10, 6185 (2020)], avoiding thickening of the lower cladding layer, consists in inserting a layer of low optical index between the lower cladding layer and the Si substrate. Said low index layer acts as a barrier to the propagation of the guided mode in the Si substrate and makes it possible to reduce the thickness of the lower cladding layer. This low index layer is for example made of oxide or nitride. While decoupling between the III-V source and the Si substrate is effective for a guided mode having a wavelength of less than 4 μm, the situation is different when the guided mode has a longer wavelength. Indeed, oxides or nitrides induce high losses when the wavelength of the guided mode is greater than 4 μm, which greatly limits spectral range of the source.

There is therefore a need to provide a means for integrating a light source capable of operating over an extended spectral range, such as a III-V source, onto a substrate having a high optical index, such as a Si substrate.

SUMMARY

An aspect of the invention solves the above problems by means of an anti-resonant reflector disposed between the light source and the substrate. Since the reflector is based on interference conditions, it can be made from materials that do not absorb the radiation emitted by the source. The light source can therefore operate in a wide spectral range.

More particularly, an aspect of the invention relates to a system comprising:

- a substrate extending in parallel to a plane, said substrate having an optical index $n_2$;
- a light source configured to have at least one stationary mode of an electromagnetic field, said mode being parallel to the plane, the source being also configured to have, for said at least one stationary mode, an effective optical index $n_{eff}$ such that $n_{eff}<n_2$.

The system is remarkable in that it also comprises an anti-resonant reflector for said at least one stationary mode, said reflector extending over the substrate and the source extending over the reflector, the reflector comprising at least one semiconductor bilayer extending in parallel to the plane, said at least one bilayer comprising: a first semiconductor sublayer and a second semiconductor sublayer, extending against the first sublayer, the first sublayer being disposed between the source and the second sublayer, the first and second sublayers respectively having optical indices $n_{301}$ and $n_{302}$ such that $n_{301}>n_{302}$ and $n_{301}>n_{eff}$, the first sublayer also having a thickness $d_{301}$ configured to form an anti-resonant cavity for said at least stationary mode.

By stationary mode, it is meant a mode of an electromagnetic field that is confined within a resonant cavity.

By mode parallel to the plane, it may be meant that the electromagnetic field is transverse to the plane. By electromagnetic mode transverse to the plane, it can be meant that the guided mode exclusively has an electrical polarisation of the electromagnetic field normal to the plane or a magnetic polarisation of the magnetic field normal to the plane.

By optical index, it is meant also the refractive index.

By effective optical index, it is meant the optical index observed by the stationary mode in the source.

By "reflector extending over the substrate", it is meant that the reflector and the substrate face each other and that the substrate can either extend directly against the substrate or be separated from the substrate by an intermediate layer.

By anti-resonant reflector, it is meant that the reflector is based on the principle of destructive interference of said at least one stationary mode, blocking the transmission of the guided mode through the substrate.

By "thickness $d_{301}$ configured to form an anti-resonant cavity for said at least one mode", it is meant that the thickness of the first sublayer of each bilayer is chosen so as not to promote resonance in the cavity formed by each first sublayer. A thickness $d_{301}$ allowing resonance is for example $\lambda/4n_{301}$. The thickness $d_{301}$ of the first sublayer of said is therefore in $$d_{301} \in ]0; \frac{\lambda}{4n_{301}}[\bigcup]\frac{(2p+1)\lambda}{4n_{301}}; \frac{(2p+3)\lambda}{4n_{301}}[$$

where $\lambda$ is a wavelength of said at least one stationary mode and $p\in\mathbb{N}$.

Decoupling between the source and the substrate is carried out by utilising an anti-resonant reflector. This is an unexpected characteristic for the person skilled in the art. Indeed, a person skilled in the art wanting to use a reflector would prefer a resonant reflector, such as a Bragg mirror. For example, the person skilled in the art know vertical cavity light sources utilising Bragg mirrors to confine a vertical guided mode.

Unexpectedly, the reflector utilises a bilayer whose sublayers have optical indices greater than the effective optical index observed by the stationary mode in the source. This is also an unexpected characteristic for the person skilled in the art who would think that this tends to promote transmission of the mode to the substrate rather than preventing it.

Thus, the stationary mode is not transmitted to the substrate, even if the latter has an optical index greater than the effective index of the source. In addition, the reflector does not require the use of oxide or nitride to operate. The stationary mode is therefore not absorbed by the reflector at wavelengths greater than or equal to 4 μm.

The reflector provides a means for integrating a light source capable of operating over an extended spectral range, such as a III-V source, onto a substrate having a high optical index, such as a Si substrate.

The anti-resonant reflector also differs from a resonant reflector, such as a Bragg mirror, in that only one of the thicknesses of the sublayers making up said at least one bilayer is constrained. This makes it easier to manufacture said anti-resonant reflector.

Beneficially, the second sublayer of said at least one bilayer can be the same as the substrate. In other words, it cannot be distinguished from the substrate. For example, it extends directly against the substrate and is made from the same material as the substrate.

In an embodiment, the thickness $d_{301}$ of the first sublayer of said at least one bilayer is such that $$d_{301} \in ]0; \frac{\lambda-\delta}{4n_{301}}[\bigcup]\frac{(2p+1)\lambda+\delta}{4n_{301}}; \frac{(2p+3)\lambda-\delta}{4n_{301}}[$$

where $\lambda$ is a wavelength of said at least one stationary mode, $p\in\mathbb{N}$ and $\delta=\lambda\times10\%$, for example $\delta=\lambda\times20\%$, or even $\delta=\lambda\times50\%$.

According to one development, the thickness $d_{301}$ of the first sublayer of said at least one bilayer is $$d_{301} = \frac{\lambda}{4n_{301}}(2N-1)\left[1-\frac{n_{eff}^2}{n_{301}^2}+\frac{\lambda^2}{4n_{301}^2 d_{eff}^2}\right]^{-1/2}$$

with $N\in\mathbb{N}^*$, $\lambda$ a wavelength of said at least one stationary mode and $d_{eff}$ a thickness of the stationary mode.

According to one alternative, the thickness $d_{301}$ of the first sublayer of said at least one bilayer is $$d_{301} \in \left[\frac{p\lambda-\delta}{2n_{301}}; \frac{p\lambda+\delta}{2n_{301}}\right]$$

with $\delta=\lambda\times50\%$, for example $\delta=\lambda\times20\%$, or even $\delta=\lambda\times10\%$.

Beneficially, the anti-resonant reflector comprises a plurality of bilayers, the second sublayer of a first bilayer of the plurality of bilayers extending against the first sublayer of a second bilayer of the plurality of bilayers.

Beneficially, the source comprises a cavity in which said at least one stationary mode of the electromagnetic field can be established, the cavity comprising a first layer called the "active region" and a second layer called the "lower cladding layer", the active region extending in parallel to the plane and over the lower cladding layer, the lower cladding layer being disposed between the active region and the reflector, the active region being also configured to emit the electromagnetic field.

Beneficially, the lower cladding layer is made of III-V material, such as InP, the first sublayer of said at least one bilayer being made of Ge and the second sublayer of said at least one bilayer being made of Si.

Beneficially, the system comprises a bonding layer separating the source and the reflector, the bonding layer having an optical index $n_5$ such that $n_5\leq n_{301}$ and for example $n_5<n_{301}$.

Beneficially, the bonding layer comprises a face, parallel to the plane comprising a diffraction grating, the lower cladding layer extending against said face of the bonding layer, against the diffraction grating.

An aspect of the invention also relates to a method for manufacturing a system comprising the following steps of:

forming, from a substrate extending in parallel to a plane and having an optical index $n_2$ less than an effective index $n_{eff}$, an anti-resonant reflector for at least one stationary mode parallel to the plane of an electromagnetic field, said reflector extending over the substrate, the reflector comprising at least one semiconductor bilayer extending in parallel to the plane, said at least one bilayer comprising: a first semiconductor sublayer and a second semiconductor sublayer extending against the first sublayer, the second sublayer being disposed between the first sublayer and the substrate, the first and second sublayers respectively having optical indices $n_{301}$ and $n_{302}$ such that $n_{301}>n_{302}$ and $n_{301}>n_{eff}$, the first sublayer also having a thickness $d_{301}$ configured to form an anti-resonant cavity for said at least one stationary mode; and forming, on the reflector, a light source configured to have said at least one stationary mode parallel to the plane of the electromagnetic field, the source being also configured to have, for said at least one stationary mode, the effective optical index $n_{eff}$ such that $n_{eff}<n_2$.

The invention and its various applications will be better understood upon reading the following description and examining the accompanying figures.

BRIEF DESCRIPTION OF THE FIGURES

The figures are set forth by way of indicating and in no way limiting purposes of the invention. Unless otherwise specified, a same element appearing in different figures has a single reference.

FIG. 1 shows a first embodiment of a system according to the invention.

FIG. 2, FIG. 3, FIG. 4 and FIG. 5 show the first results of digital simulation carried out from a second embodiment of the system according to the invention.

FIG. 6, FIG. 7, FIG. 8 and FIG. 9 show second results of digital simulation carried out from a system according to prior art.

FIG. 10 and FIG. 11 show third results of digital simulation carried out from a third embodiment of the system according to the invention.

FIG. 12 shows forth a fourth result of digital simulation carried out from a system comprising a Bragg mirror instead of a reflector according to an embodiment of the invention.

FIG. 13 shows an implementation of a method for manufacturing the system according to an embodiment of the invention.

DETAILED DESCRIPTION

FIG. 1 shows a first embodiment of a system 6 according to an embodiment of the invention. It also shows an enlarged view of a portion of the system 6, as well as an optical index curve n(y) as a function of a depth y. It furthermore shows an orthonormal reference frame {X; Y; Z}.

The system 6 comprises a light source 1, a substrate 2 and a reflector 3.

The substrate 2 extends in parallel to a plane P. With respect to the orthonormal reference frame {X; Y; Z}, the plane P corresponds to the plane {X; Z}. FIG. 1 represents only a portion of the substrate 2. Since the latter may be a bulk substrate, it may have very large dimensions compared to the other elements of the system 6. For example, the substrate 2 is made of silicon.

By light source 1, or simply source 1, it is meant a source of electromagnetic radiation. For example, it is a laser source or an electroluminescent source. The source 1 is beneficially configured to emit a light beam in a wavelength range between 0.8 μm and 20 μm. This range comprises, for example, the near infrared and part of the mid-infrared. Emission can be carried out from a side surface of the source 1 or from a surface parallel to the plane P. In the first case, the source 1 is called a "side emitting" source, whereas in the latter case, the source 1 is called a "surface emitting" source.

In the embodiment in FIG. 1, the source 1 has a ridge shape, stretching in the direction Z. In other words, it has a large aspect ratio with a length, measured along Z, of more than 200 μm and a width, measured along X, of less than 50 μm. The source 1 may have a height, measured along Y, of less than 20 μm, or even less than 10 μm.

The source 1 is configured to emit an electromagnetic field and to confine this electromagnetic field in one or more stationary modes. These may be stationary modes, such as those observable in a laser cavity. The source is distinctive in that each stationary mode is parallel to the plane P. By mode parallel to the plane, it is meant that the field has, exclusively:

- a polarisation of the electric field perpendicular to the plane P; or
- a polarisation of the magnetic field perpendicular to the plane P.

It is meant that the field does not have the two polarisations (of the electric field and the magnetic field) which are both substantially parallel to the plane P (that is, parallel to within 10°, or even 5°). In the mode parallel to the plane P, it is meant that the mode is for example transverse to the plane P. In other words, the electromagnetic field comprises for example:

- a polarisation of the electric field normal to the plane (that is, parallel to the direction Y) and a polarisation of the magnetic field parallel to the plane P; or
- a polarisation of the electric field $E_X$ parallel to the plane P and a polarisation of the magnetic field $H_Y$ normal to the plane P (as illustrated in FIG. 1).

Unless otherwise stated, only one stationary mode of the field in source 1 will be considered, in order to simplify the description of the invention. However, the teachings apply to each stationary mode when the source 1 has a plurality of stationary modes.

Different layers 110, 111, 112 making up the source 1 may have different optical indices. An example is plotted in the optical index curve n(y). The different indices plotted are considered along the dotted line A. However, each stationary mode in the source 1 may have an effective optical index $n_{eff}$ which may have a different value from the optical indices of the layers of the source 1, especially due to the geometry of the different layers. This is why the effective optical index $n_{eff}$ of the stationary mode is considered. The effective optical index $n_{eff}$ can be determined digitally. An estimate of the effective optical index $n_{eff}$ can be determined from the average optical index in the source 1, calculated along the line A. It is also desirable to take account of the elements that enable confinement of the electric field in the source 1, such as the geometry (thickness and/or width) of the other so-called "cladding" semiconductor layers or the presence of reflective layers (such as metal electrodes or a diffraction grating).

The substrate 2 has an optical index $n_2$. When $n_{eff}>n_2$, the stationary mode of the source 1 is not likely to couple with the substrate 2. By contrast, when $n_{eff}<n_2$, the stationary mode is likely to couple with the substrate 2, increasing the optical losses and reducing the effectiveness of the source 1.

To avoid this drawback, an aspect of the invention provides for the reflector 3 to be disposed between the substrate 2 and the source 1. The reflector 3 is distinctive in that it is configured to be anti-resonant in at least one stationary mode of the source 1 and, in an embodiment, all the stationary modes of the source 1. In this way, the transmission of the stationary modes to the substrate 2 is reduced and the effectiveness of the source 1 is maintained, even if the substrate 2 has a high optical index enabling it to couple with the stationary modes of the source. 1.

The reflector 3 comprises, for example, at least one optical cavity configured so as to be anti-resonant in the stationary mode. The optical cavity, extending in parallel to the plane P and between the source 1 and the substrate 2, prevents transmission of the stationary mode to the substrate 2. The source 1 is entirely superimposed, in the direction normal to the plane P, on the reflector 3. Thus, the reflector 3 extends under the source 1, beyond the source 1, so as to effectively block the transfer of the stationary mode to the substrate 2.

In FIG. 1, the reflector 3 comprises three semiconductor bilayers 31, 32, 33, each extending in parallel to the plane P. Each bilayer 31, 32, 33 comprises a first semiconductor sublayer 301 and a second semiconductor sublayer 302. FIG. 1 shows an enlarged view of the reflector and a portion of the substrate 2. For each bilayer 31, 32, 33, the first sublayer 301 extends against the second sublayer 302. Each bilayer 31, 32, 33 is oriented such that the first sublayer 301 is disposed between the second sublayer 302 and the source 1. A single bilayer 31 may be sufficient to form the non-resonant optical cavity. However, it is beneficial to have a plurality of bilayers 31, 32, 33 (and therefore a plurality of anti-resonant cavities) to improve decoupling between the source 1 and the substrate 2. In the case of several bilayers 31, 32, 33, said bilayers are, in an embodiment, in contact in twos, that is, stacked directly one on top of the other, so as to form a vertical stack of bilayers 31, 32, 33.

In the embodiment in FIG. 1, the second sublayer 302 of one 33 of the bilayers is the same as the substrate 2. Indeed, to simplify manufacture, it may be beneficial for one of the second sublayers 302 to be a portion of the substrate 2.

In order to form an optical cavity, each first sublayer 301 has an optical index $n_{301}$ strictly greater than the optical index $n_{302}$ of the second sublayer 302 or of the second sublayers with which it is in contact.

For each bilayer 31, 32, 33, the optical index $n_{301}$ of the first sublayer 301 is strictly greater than the optical index $n_{302}$ of the second sublayer 302. Otherwise, for each bilayer 31, 32, 33, the optical indices verify $n_{301}>n_{302}$.

The optical index curve n(y) curve in FIG. 1 shows an example of alternation for the optical indices $n_{301}$, $n_{302}$ of the first and second sublayers 301, 302. This is a simple embodiment of the reflector 3 in which the first sublayers 301 all have the same optical index $n_{301}$. Similarly, the second sublayers 302 also have the same optical index $n_{302}$.

In this example, the first sublayers 301 can be made of germanium and the second sublayers 302 can be made of silicon. This embodiment is all the more beneficial when the substrate 2 is also made of silicon. Thus, one of the second sublayers 302 can be the same as the substrate 2.

The first bilayer 31 disposed in the vicinity of the source 1 interacts directly with the stationary mode in the source 1. The anti-resonance condition requires its first sublayer 301 to have an optical index $n_{301}$ strictly greater than the effective optical index $n_{eff}$ associated with the stationary mode. Otherwise, for each bilayer 31, 32, 33, $n_{301}>n_{eff}$.

Thus, the first sublayer 301, having an index $n_{301}>n_{eff}$ and $n_{301}>n_{302}$ form a plurality of optical cavities.

The anti-resonance condition can be obtained by controlling the thickness $d_{301}$ of each first sublayer 301, measured perpendicularly to the plane P, in other words, the thickness of each anti-resonant cavity in a direction perpendicular to the stationary mode in the source. The thickness $d_{301}$ may be a function of the wavelength λ of the stationary mode of the source 1. λ is for example between 0.8 μm and 20 μm. The wavelength λ corresponds for example to a maximum amplitude of the electromagnetic field in the stationary mode. It can be set by the source 1 according to the established stationary mode.

For example, the thickness $d_{301}$ of each first sublayer 301 may be such that $$d_{301} \in \left]0; \frac{\lambda}{4n_{301}}\right[ \bigcup \left]\frac{(2p+1)\lambda}{4n_{301}}; \frac{(2p+3)\lambda}{4n_{301}}\right[$$

where p∈ ℕ and ∪ is the union operator.

The thickness $d_{301}$ of the first sublayer 301 can take a value other than $\lambda/4n_{301}$, this value promotes resonance of the mode in the first sublayers. Indeed, a thickness, for example equal to $d_{301}=(2p+1)\lambda/4n_{301}$ would promote the transfer of the stationary mode through the reflector 3 and would therefore reduce the effectiveness of the source 1.

In order to optimise the anti-resonance of the reflector 3, each first sublayer 301 beneficially has a thickness $d_{301}$ such that $$d_{301} \in \left]0; \frac{\lambda-\delta}{4n_{301}}\right[ \bigcup \left]\frac{(2p+1)\lambda+\delta}{4n_{301}}; \frac{(2p+3)\lambda-\delta}{4n_{301}}\right[$$

where δ=10% λ. Thus, the thicknesses $d_{301}$ of the first sublayers 301 have values far from $(2p+1)\lambda/4n_{301}$ in order to limit the resonance of the mode in the first sublayers 301 and thus decouple the stationary mode from the substrate 2. In an embodiment, δ=20% λ or even δ=50% λ.

The thickness $d_{301}$ can be adjusted within the above interval by performing an optimisation, for example digital optimisation, to minimise the transmission of the stationary mode to the substrate 2.

In one embodiment, the thickness $d_{301}$ can be in the range $$d_{301} \in \left[\frac{p\lambda-\delta}{2n_{301}}; \frac{p\lambda+\delta}{2n_{301}}\right]$$

For example, the thickness $d_{301}$ can be equal to $$d_{301} = \frac{p\lambda}{2n_{301}}$$

This thickness is the exact opposite to the thickness that can be implemented in a resonant reflector such as a Bragg reflector.

In an embodiment, the thickness $d_{301}$ is:

$$d_{301} = \frac{\lambda}{4n_{301}}(2N-1)\left[1 - \frac{n_{eff}^2}{n_{301}^2} + \frac{\lambda^2}{4n_{301}^2 d_{eff}^2}\right]^{-1/2}$$

where N∈ ℕ*, $d_{eff}$ and $n_{eff}$ are respectively an effective thickness of the stationary mode in the source 1 and the effective optical index observed by the stationary mode in source 1. The effective thickness $d_{eff}$ of the mode corresponds to a thickness that the stationary mode has in the source 1. It corresponds, for example, to a thickness $d_{11}$ of a cavity 11 of the source 1 in which the stationary mode is established. The effective index $n_{eff}$ can be determined from the optical indices of the elements making up the cavity 11 in which the stationary mode is established. The effective index $n_{eff}$ may be equal to the average of the optical indices of the components of the cavity 11.

In the embodiment in FIG. 1, the source 1 is a laser source. It comprises a laser cavity 11 configured to emit an electromagnetic field and to confine this electromagnetic field in a stationary mode. The cavity 11 extends in parallel to the plane P. For example, it has a width, measured in the direction X, parallel to the plane (and in the plane of FIG. 1) of between 2 and 50 μm. It may furthermore have a height, also referred to as the thickness $d_{11}$ measured perpendicularly to the plane P, of between 2 μm and 10 μm. It may also have a length, measured in the direction Z, of between 20 μm and 1000 μm, or even between 100 μm and 5000 μm (this is a "ridge" type laser).

In the embodiment in FIG. 1, the source 1 comprises a cavity 11 in which the stationary mode(s) can be established. The cavity 11 comprises a plurality of layers extending in parallel to the plane P. For example, the cavity 11 comprises a first layer 110, which is referred to as an "active region" or "amplifying region". The active region 110 is configured to emit the electromagnetic field. The cavity 11 also comprises a second semiconductor layer 111, called the "lower cladding layer", extending between the active region 110 and the reflector 3. The active region 110 rests on the internal cladding layer 111. The cavity 11 also comprises a third semiconductor layer 112, called the "upper cladding layer", resting on the active region 110. The active region 110 separates the cladding layers 111, 112. The three layers thus form a vertical stack. Said stack is delimited by one or more flanks 11*a*, 11*b* such that the three aforementioned layers 110, 111, 112 are in vertical alignment with each other.

The active region 110 can be configured so that the emission of the electromagnetic field is at least spontaneous and, in an embodiment, spontaneous and stimulated. The latter case enables the source 1 to operate in laser mode. The emission can be based on interband cascade emission. It may be based on inter-subband emission, also known as quantum cascade emission. To enable quantum cascade emission, the active region 110 comprises, for example, a stack of sublayers of III-V material, forming a succession of quantum wells and potential barriers. For example, the stack of sublayers extends in parallel to the plane P.

The cladding layers 111, 112 make it possible to confine the electromagnetic field in the cavity 11, especially along the direction Y, normal to the plane. In this way, the electromagnetic field remains localised at the active region 110 and makes it possible, for example, to promote stimulated emission from the active region 110. For this, the cladding layers 111, 112 are for example configured to have optical indices $n_{111}$, $n_{112}$ strictly less than an average optical index $n_{110}$ of the active region 110. By average optical index $n_{110}$ of the active region 110, it is meant an optical index taking account of the indices of the layers or sublayers making up the active region 110. In this way, the electromagnetic field emitted by the active region 110 is confined to the vicinity of the active region 110.

The optical indices $n_{111}$, $n_{112}$ and $n_{110}$ of the cladding layers 111, 112 and the active region 110 are plotted on the index curve n(y).

In order to activate spontaneous emission from the active region 110, the source 1 comprises a system for circulating an electric current in the active region 110. This system comprises, for example, the cladding layers 111, 112 when the latter are doped. They thus enable the electric current to be conducted through the active region 110.

The source 1 may also comprise conductive electrodes 12 allowing the circulation of electric current in the cladding layers 111, 112 and in particular in the active region 110. A first conductive electrode 121, for example made of Au or Ti, extends in contact with the upper cladding layer 112 (if the latter is doped) so as to make electrical contact. Similarly, two second conductive electrodes 122, for example made of Au or Ti, extend against a portion of the lower cladding layer 111 so as to make electrical contact. The two second electrodes 122 also extend in parallel to the flanks 11*a*, 11*b* of the cavity 11. To prevent the cladding layers 111, 112 and the active region 110 from being short-circuited by the second electrodes 122, the source 1 also comprises two insulating spacers, for example made of SiN, disposed between the cavity 11 and each second electrode 122. The spacers extend for example in contact with each flank 11*a*, 11*b* of the cavity 11 and separate the cavity 11 from the second electrodes 122.

When the source 1 is a III-V type source. The cladding layers 111, 112 are for example made of a III-V alloy such as InP. The active region 110 comprises, for example, a multilayer of InGaAs/AlInAs or InAlAs/AlGaInAs. To integrate the III-V source onto the Si substrate 2, each first sublayer 301 of the reflector 3 may be made of Ge and each second sublayer 302 of the reflector 3 may be made of Si.

Indeed, it is easy to make alternating Si and Ge sublayers from a Si bulk substrate, for example by growth. In addition, this growth can be made using standard methods implemented in the so-called "CMOS" (Complementary Metal-Oxide-Semiconductor) technology.

In order to facilitate the transfer of the source 1 to the reflector 3, the system 6 may comprise a bonding layer 5, disposed between the source 1 and the reflector 3. The bonding layer 5 moreover extends, in an embodiment, in contact with the reflector 3, the source 1 resting directly on the bonding layer 5. By "bonding layer", it is meant a layer whose function is to enable transfer, also known as bonding, to the reflector 3. Indeed, it can be difficult to transfer a layer of III-V material (such as the lower cladding layer 111) directly onto a Ge layer. The bonding layer 5 is therefore made of a material which, on the one hand, makes it easier to transfer the source 1 onto it and which, on the other hand, does not interfere negatively with the reflector 3 or with the stationary mode in the source 1.

In the embodiment illustrated, the bonding layer 5 extends over a first sublayer 301 of the reflector 3. To avoid interference, the bonding layer 5 has, in an embodiment, an optical index $n_5$ such that $n_5<n_{301}$. Thus the second sublayer 301 of the reflector 3, which is in contact with the bonding layer 5, can act as an optical cavity. In an embodiment, $n_5 \leq n_{302}$. It may be beneficial that $n_5 \leq n_{eff}$, however, it is expected that the bonding layer 5 is not made of a material, such as an oxide or a nitride, which can absorb the stationary mode when it belongs to a wavelength range greater than 4 μm. Thus, a bonding layer 5 having an index $n_5$ holding $n_{eff} \leq n_5 \leq n_{302}$ provides a good compromise. For example, the bonding layer 5 can be made from the same material as the second sublayers 302 of the reflector 3, such as Si.

The source 1 can be a distributed feedback (DFB) laser source. In a DFB source, the stationary mode is established in a cavity, in response to the action of a diffraction grating extending over one face of said cavity. In the case of the source 1, the diffraction grating extends over one of the faces of the cavity 11 and along the direction Z. Thus, the stationary mode is established in the cavity 11, along the direction Z.

For example, the diffraction grating extends over the upper cladding layer 112. For example, the diffraction grating extends over a face of one of the cladding layers 111, 112, said face being opposite to the active region 110. According to a first example, the diffraction grating extends over a face of the upper cladding layer 112, between said layer 112 and the upper electrode 121 extending over the cavity 11. In one development, the diffraction grating may be etched into the face of said upper cladding layer 112. The diffraction grating is for example formed by trenches, oriented in the direction X, and spaced apart at a constant pitch in the direction Z.

According to one alternative, the diffraction grating extends over the lower cladding layer 111. For example, it extends over one face of the lower cladding layer 111, between said layer 111 and the bonding layer 5. The diffraction grating may be etched into the face of said lower cladding layer 111. Alternatively, the diffraction grating may be formed in, for example etched into, the bonding layer 5.

FIGS. 2 to 13 show the results of digital simulations carried out by considering several embodiments of the reflector 3. FIGS. 6 to 9 are moreover based on a reflector of prior art.

All the simulations were carried out with a same source 1. It comprises a cavity 11 as described with reference to FIG. 1. The cavity has a width, measured along X, of 10 μm and a height, measured along Y, of 3 μm. The cavity 11 has a length, measured along Z, of 250 μm.

The lower cladding layer 111 is made of InP and has a thickness of 0.6 μm (unless otherwise indicated, thicknesses indicated are measured perpendicularly to the plane P). The active region 110 has a thickness of 1.72 μm. The upper cladding layer 112 is made of InP and has a thickness of 1.3 μm. An InGaAs layer separates the active region 110 from the lower cladding layer 111. It has a thickness of 0.3 μm. An InP layer separates this InGaAs layer from the active region 110 and has a thickness of 0.2 μm. An InGaAs layer also separates the active region from the upper cladding layer 112. It has a thickness of 0.02 μm. A 0.1 μm InGaAs layer separates the upper cladding layer from the first conductive electrode 121. This electrode 121 is made of Au and has a thickness of 0.5 μm. The second conductive electrodes 122 extending facing the flanks of the cavity 11 are also made of Au and have thicknesses, measured in parallel to the plane P, of 0.9 μm. A SiN spacer separates each second electrode 122 from the cavity 11. The spacer has a thickness, also measured in parallel to the plane P, of 0.9 μm.

The substrate 2 is made of Si.

The stationary mode established in the cavity 11 is monochromatic and has a wavelength of 4.5 μm. The optical index of Si is 3.47. The optical index of Ge is 4. The optical index of InP is 3.11. The average optical index of the active region 110 is 3.35.

FIGS. 2 to 5 set forth the first results of digital simulation carried out from a first embodiment of the reflector 3. The reflector 3 comprises a stack of three bilayers 31, 32, 33. The stack extends over the substrate 2. The first sublayers 301 are made of Ge and the second sublayers 302 are made of Si. The first sublayers 301 each have a thickness $d_{301}$=0.496 μm. The second sublayers 302 each have a thickness, measured perpendicularly to the plane, of 0.607 μm.

The bilayer extending directly against the substrate 2 comprises a second sublayer 302 which is indistinguishable from the substrate 2.

The system also comprises a bonding layer 5, made of Si, with a thickness of 0.255 μm. The bonding layer 5 extends directly against the reflector 3 (and in this case on a Ge sublayer) and the source 1 (and more particularly the lower cladding layer 111) extends against the bonding layer 5.

The dimensions of the reflector 3, and in particular the first and second sublayers 301, 302, have been determined by means of an optimisation algorithm. The algorithm is moreover based on genetic optimisation. The minimised optimisation criterion is proportional to the optical losses of the stationary mode in the substrate 2. It is in this case the imaginary part of the effective optical index of the stationary mode.

FIGS. 2 and 3 show, in grey scale, an amplitude of the electric field in the direction X (parallel to the plane P) and the direction Y (normal to the plane P) respectively. In other words, FIG. 2 shows the amplitude of the electric field for a mode $TE_{00}$ and FIG. 3 shows the amplitude of the electric field for a mode $TM_{00}$.

FIGS. 2 and 3 show that the modes considered are confined in the cavity 11. Moreover, they extend little, if at all, into the reflector 3, and negligibly into the substrate 2.

The imaginary part $Im(n_{eff})$ of the effective optical index of the stationary mode in the cavity 11 is proportional to the losses experienced by the stationary mode. It is therefore proportional to its level of coupling with the substrate 2.

For FIGS. 2 and 3, $Im(n_{eff})$ is equal to $0.6\times10^{-3}$ and $2\times10^{-3}$ respectively.

FIGS. 4 and 5 show the propagation of a wave $TM_{00}$ in the cavity 11 and in particular along the direction Z along which the cavity 11 extends. The mode considered is not stationary but propagative. However, it allows the effect of the reflector 3 on the propagation of the field in the system 6 to be visualised. The wave is generated at Z=0 μm and propagates over 250 μm.

The amplitude of the field $E_Y$ is shown in grey scale in FIG. 5. The corresponding power is plotted in FIG. 4. FIG. 5 shows that the amplitude of the field decreases as the wave propagates along Z. The power loss, illustrated in FIG. 4, is less than 40%.

By way of comparison, FIGS. 6 to 9 set forth results of digital simulation carried out from a system 6 comprising an oxide layer instead of the reflector 3, as taught in prior art.

FIGS. 6 and 7 also show, in grey scale, an amplitude of the electric field of the modes $TE_{00}$ and $TM_{00}$.

Unlike FIGS. 2 and 3, confinement is less effective with the oxide layer. The stationary modes extend significantly beyond the cavity 11 and the oxide layer, into the substrate 2. The result is particularly significant for the mode $TM_{00}$ in FIG. 7.

For FIGS. 6 and 7, $Im(n_{eff})$ is equal to $4\times10^{-3}$ and $4\times10^{-3}$ respectively. The imaginary part is therefore significantly higher. The reflector 3 therefore reduces optical losses in the stationary mode.

FIGS. 8 and 9 show the propagation of a wave $TM_{00}$ in the cavity 11 decoupled from the substrate 2 by means of the oxide layer.

The amplitude of the field $E_Y$ is shown in grey scale in FIG. 9. The corresponding power is plotted in FIG. 8. FIG. 9 shows that the amplitude of the field decreases rapidly as the wave propagates along Z. The power loss, illustrated in FIG. 8, is drastic, since close to 100% for Z=250 μm.

FIGS. 10 and 11 set forth results of digital simulation carried out from a second embodiment of the reflector 3. Unlike the embodiment in FIGS. 2 to 5, the thickness $d_{301}$ of each first sublayer 301 follows:

$$d_{301} = \frac{\lambda}{4n_{301}}(2N-1)\left[1 - \frac{n_{eff}^2}{n_{301}^2} + \frac{\lambda^2}{4n_{301}^2 d_{eff}^2}\right]^{-1/2}$$

Herein, the thickness of each first sublayer 301 considered is 2.12 μm. The thickness of each second sublayer 302 is 2.56 μm.

FIGS. 10 and 11 also show, in grey scale, an amplitude of the electric field of modes $TE_{00}$ and $TM_{00}$. $Im(n_{eff})$ is equal to $0.1\times10^{-3}$ and $0.3\times10^{-3}$ respectively. The imaginary part is therefore reduced compared to that obtained in FIGS. 6 and 7. Thus, since the reflector 3 is anti-resonant, it significantly reduces optical losses in the stationary mode.

By way of comparison, FIG. 12 sets forth a result of digital simulation obtained from a system 6 in which the reflector 3 is replaced with a Bragg mirror. Unlike the embodiment in FIGS. 2 to 5, the thicknesses of the Si and Ge layers are configured so that the mirror is resonant, rather than anti-resonant.

FIG. 12 shows, in grey scale, an amplitude of the electric field in the mode $TM_{00}$. The imaginary part of the effective optical index $Im(n_{eff})$ is equal to $4\times10^{-3}$, which is equivalent to that obtained when the anti-resonant reflector 3 is replaced with an oxide layer. The Bragg mirror is therefore of no interest compared with an oxide layer as implemented according to teachings of prior art.

The implementation of an anti-resonant reflector 3 therefore provides good means for effectively decoupling a stationary mode established in a source 1 disposed on a substrate with a high optical index.

FIG. 13 shows schematically an example of the implementation of a method 7 for manufacturing the system 6. The method 7 comprises two major steps: forming 71 the reflector 3 and forming 72 the source 1 on the reflector 3.

Forming 71 the reflector 3 is beneficially carried out from the substrate 2. The reflector 3 is, in an embodiment, moreover formed full plate, that is, over the entire surface of the substrate 2. Moreover, when the formation of the reflector 3 is complete, the substrate 1 comprises, on one of its faces, at least one bilayer 31, 32, 33, or even a bonding layer 5. The set of substrate 2 and reflector 3 moreover forms what can be called a functionalised substrate, in the sense that the substrate 2 is prepared to receive a source 1 such as a III-V source.

Forming 71 the reflector 3 comprises, for example, successively depositing sublayers and layers according to the above mentioned teachings. The manufacture of these layers involves methods known to the person skilled in the art.

Characteristics of the source 1 and of the stationary mode are, in an embodiment, known before performing forming 71 the reflector 3. In this way, the characteristics of the reflector 3, which are for example the optical indices of the bilayers making up the reflector 3 or the thicknesses of the sublayers making up each bilayer, can be determined before they are manufactured. Alternatively, when the characteristics of the source 1 and/or the stationary mode are not known in advance, the reflector 3 can be formed by considering a target effective optical index and a target wavelength. In this way, the functionalised substrate can be manufactured and matching between the reflector 3 and the source 1 is thereby based on the choice of this source 1.

Forming 72 the source 1 may involve a bonding step, such as molecular bonding. For example, the source 1 can be made separately from the reflector 3, for example from a III-V substrate. It can then be transferred onto the functionalised substrate resulting from the step 71 of forming the reflector 3. Alternatively, the source 1 can be made directly from the free surface of the reflector 3 (or the bonding layer 5).

In order to form a laser source 1, the bonding layer 5 of the functionalised substrate may have a diffraction grating. For example, the diffraction grating is etched into the bonding layer 5 after the latter has been deposited on the reflector 3. This etching step is beneficially part of the step of forming the reflector 3.

It will be appreciated that the various embodiments and aspects of the inventions described previously are combinable according to any technically permissible combinations.

The articles "a" and "an" may be employed in connection with various elements, components, processes or structures described herein. This is merely for convenience and to give a general sense of the elements, processes or structures. Such a description includes "one or at least one" of the elements or components. Moreover, as used herein, the singular articles also include a description of a plurality of elements or components, unless it is apparent from a specific context that the plural is excluded.

The invention claimed is:

1. A system comprising:

a substrate extending in parallel to a plane, the substrate having an optical index $n_2$;

a light source configured to have at least one stationary mode of an electromagnetic field, said at least one stationary mode being parallel to the plane, the source being also configured to have, for said at least one stationary mode, an effective optical index $n_{eff}$ such that $n_{eff}<n_2$;

an anti-resonant reflector for said at least one stationary mode, said anti-resonant reflector extending over the substrate and the source extending over the anti-resonant reflector, the anti-resonant reflector comprising at least one semiconductor bilayer extending in parallel to the plane, said at least one semiconductor bilayer comprising: a first semiconductor sublayer and a second semiconductor sublayer extending against the first semiconductor sublayer, the first semiconductor sublayer being disposed between the source and the second semiconductor sublayer, the first and second semiconductor sublayers respectively having optical indices $n_{301}$ and $n_{302}$ such that $n_{301}>n_{302}$ and $n_{301}>n_{eff}$, the first sublayer also having a thickness $d_{301}$ configured to form an anti-resonant cavity for said at least one stationary mode.

2. The system according to claim 1, wherein a thickness $d_{301}$ of the first semiconductor sublayer of said at least one semiconductor bilayer is such that $$d_{301} \in ]0; \frac{\lambda-\delta}{4n_{301}}[\bigcup]\frac{(2p+1)\lambda+\delta}{4n_{301}}; \frac{(2p+3)\lambda-\delta}{4n_{301}}[$$

where λ is a wavelength of said at least one stationary mode, $p\in\mathbb{N}$ and $\delta=\lambda\times10\%$.

3. The system according to claim 1, wherein the thickness $d_{301}$ of the first semiconductor sublayer of said at least one semiconductor bilayer is $$d_{301} = \frac{\lambda}{4n_{301}}(2N-1)\left[1-\frac{n_{eff}^2}{n_{301}^2}+\frac{\lambda^2}{4n_{301}^2 d_{eff}^2}\right]^{-1/2}$$

with $N\in\mathbb{N}^*$, λ a wavelength of the at least one stationary mode and $d_{eff}$ a thickness of the stationary mode.

4. The system according to claim 1, wherein the thickness $d_{301}$ of the first semiconductor sublayer of said at least one semiconductor bilayer is $$d_{301} \in \left[\frac{p\lambda - \delta}{2n_{301}}; \frac{p\lambda + \delta}{2n_{301}}\right]$$

with $\delta = \lambda \times 50\%$.

5. The system according to claim 1, wherein the anti-resonant reflector comprises a plurality of bilayers, the second sublayer of a first bilayer of the plurality of bilayers extending against the first sublayer of a second bilayer of the plurality of bilayers.

6. The system according to claim 1, wherein the source comprises a cavity in which said at least one stationary mode of the electromagnetic field can be established, the cavity comprising a first layer forming an active region and a second layer forming a lower cladding layer, the active region extending in parallel to the plane and over the lower cladding layer, the lower cladding layer being disposed between the active region and the reflector, the active region being also configured to emit the electromagnetic field.

7. The system according to claim 6, wherein the lower cladding layer is made of III-V material, the first sublayer of said at least one bilayer being made of Ge and the second sublayer of said at least one bilayer being made of Si.

8. The system according to claim 7, wherein the lower cladding layer is made of InP.

9. The system according to claim 1, comprising a bonding layer separating the source and the anti-resonant reflector, the bonding layer having an optical index $n_5$ such that $n_5 \leq n_{301}$.

10. The system according to claim 9, wherein the source comprises a cavity in which said at least one stationary mode of the electromagnetic field can be established, the cavity comprising a first layer forming an active region and a second layer forming a lower cladding layer, the active region extending in parallel to the plane and over the lower cladding layer, the lower cladding layer being disposed between the active region and the reflector, the active region being also configured to emit the electromagnetic field, and wherein the bonding layer comprises a face, parallel to the plane, comprising a diffraction grating, the lower cladding layer extending against said face of the bonding layer, against the diffraction grating.

11. A method for manufacturing a system comprising:

forming, from a substrate extending in parallel to a plane and having an optical index $n_2$ less than an effective index $n_{eff}$, an anti-resonant reflector for at least one stationary mode parallel to the plane of an electromagnetic field, said reflector extending over the substrate, the reflector comprising at least one semiconductor bilayer extending in parallel to the plane, said at least one bilayer comprising: a first semiconductor sublayer and a second semiconductor sublayer extending against the first semiconductor sublayer, the second semiconductor sublayer being disposed between the first semiconductor sublayer and the substrate, the first and second semiconductor sublayers respectively having optical indices $n_{301}$ and $n_{302}$ such that $n_{301} > n_{302}$ and $n_{301} > n_{eff}$, the first semiconductor sublayer also having a thickness $d_{301}$ configured to form an anti-resonant cavity for said at least one stationary mode, and forming, on the anti-resonant reflector, a light source configured to have said at least one stationary mode parallel to the plane of the electromagnetic field, the source being also configured to have, for said at least one stationary mode, the effective optical index $n_{eff}$ such that $n_{eff} < n_2$.

* * * * *